United States Patent [19]
Sakamoto

[11] 3,778,736

[45] Dec. 11, 1973

[54] CHANNEL SELECTION SYSTEM

[75] Inventor: Yoichi Sakamoto, Toyonaka, Japan

[73] Assignee: Matsushita Electric Industrial Co., Ltd., Kadoma, Japan

[22] Filed: Sept. 13, 1971

[21] Appl. No.: 179,860

[30] Foreign Application Priority Data

| | | |
|---|---|---|
| Sept. 12, 1970 | Japan | 45/80273 |
| Sept. 12, 1970 | Japan | 45/80274 |
| Sept. 12, 1970 | Japan | 45/80275 |
| Sept. 12, 1970 | Japan | 45/80276 |

[52] U.S. Cl. .......... 334/15, 325/465, 334/1

[51] Int. Cl. .......... H03j 5/04

[58] Field of Search .......... 334/1, 7, 15, 14; 325/422, 459, 464, 465

[56] References Cited

UNITED STATES PATENTS

| | | | |
|---|---|---|---|
| 3,654,557 | 4/1972 | Sakamoto et al. | 334/15 X |
| 3,652,960 | 3/1972 | Sakamoto et al. | 334/15 |
| 3,518,586 | 6/1970 | Nilssen et al. | 334/15 X |
| 3,568,112 | 3/1971 | Thomas | 334/15 X |
| 3,596,183 | 7/1971 | Spies | 334/15 X |

*Primary Examiner*—Paul L. Gensler
*Attorney*—Craig et al.

[57] ABSTRACT

A pair of memory circuits, each comprising four binary memory units, are connected to a matrix network for applying binary coded digital outputs of the memory circuits to a set of logic gates, for instance NAND-gates, which, in response to said output signals of the memory circuits, connect a selected voltage-feeding network to variable-capacitance diodes of selected tuning circuits.

9 Claims, 4 Drawing Figures

INVENTOR
YOICHI SAKAMOTO
BY
Craig, Antonelli & Hill
ATTORNEYS

INVENTOR
YOICHI SAKAMOTO
BY
Craig, Antonelli & Hill
ATTORNEYS

INVENTOR
YOICHI SAKAMOTO
BY
Craig, Antonelli & Hill
ATTORNEYS

CHANNEL SELECTION SYSTEM

BACKGROUND OF THE INVENTION

This invention relates to a channel selection system for electric communication receivers, such as television receivers. This invention specially relates to a channel selection system, wherein channel selection is made by varying the voltage imparted to variable-capacitance diodes in the channel selectors by appropriately controlling an electronic circuit network with digital signals.

Hitherto, in tuners comprising variable capacitance diodes which are used as tuning devices, the voltages imparted to the variable capacitance diodes have conventionally been switched by mechanical switches. In such conventional systems, owing to the normal wear and damage to which mechanical parts are subjected, the durability of such tuners is not satisfactory with the result that such units have a high probability of trouble. Moreoover, the conventional tuner requires a complicated mechanical structure, and its speed of channel selection is not sufficiently high for desirable operation. Besides, owing to the mechanical structure of such units, it has been difficult to utilize remote-control means therewith. Also, the conventional tuner for an all wave receiver set does not provide for easy recognition of the channel.

SUMMARY OF THE INVENTION

Therefore, the present invention provides a novel channel selection system which is capable of selecting a desired channel without the need for mechanical switches in the tuners, by utilizing electronic logic circuits which are far more durable in comparison with mechanical switches.

DETAILED DESCRIPTION OF THE INVENTION

Figure 1:
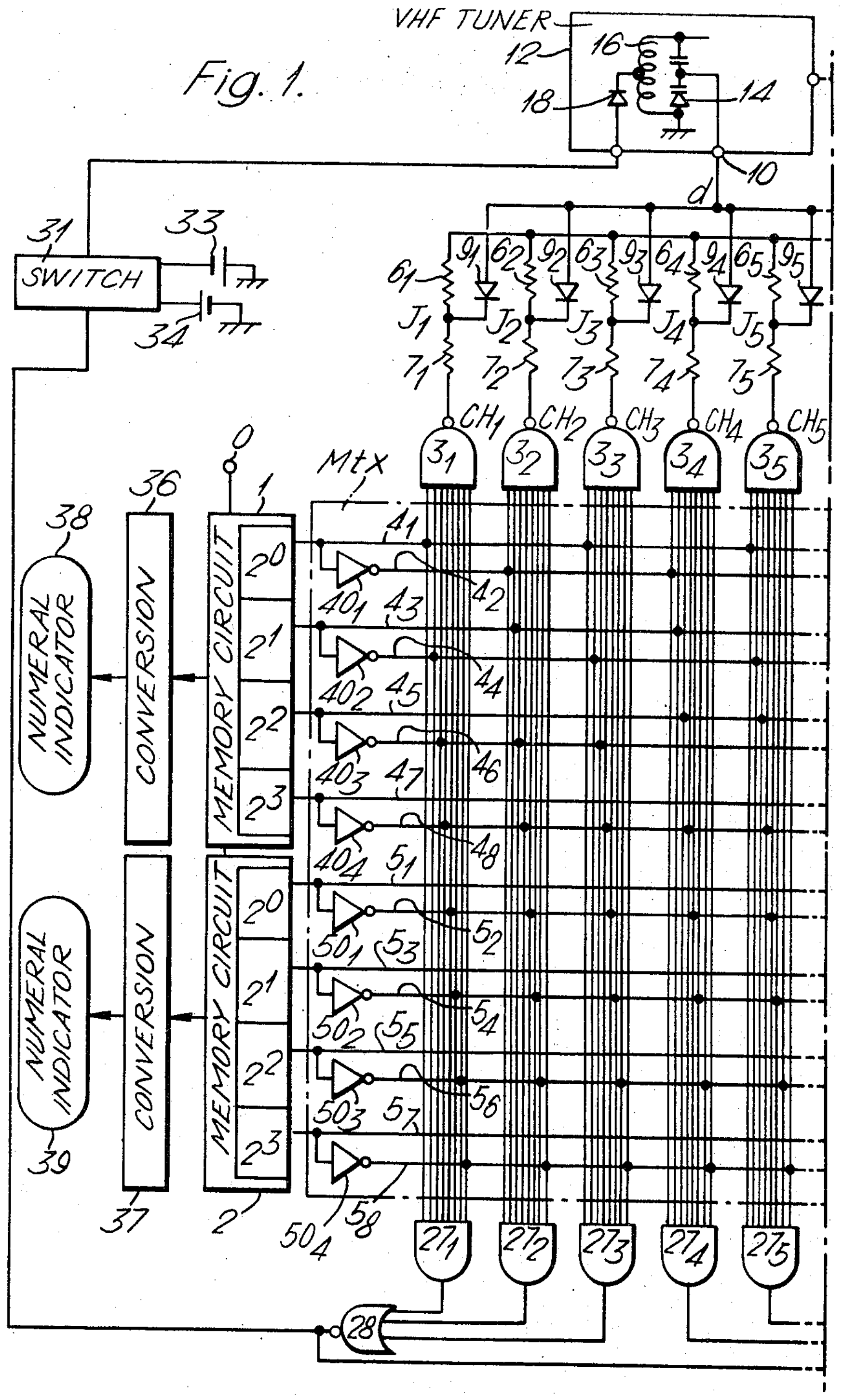
FIG. 1 and FIG. 2 jointly constitute a circuit diagram of a channel selection system of a television receiver embodying the present invention.
Figure 2:
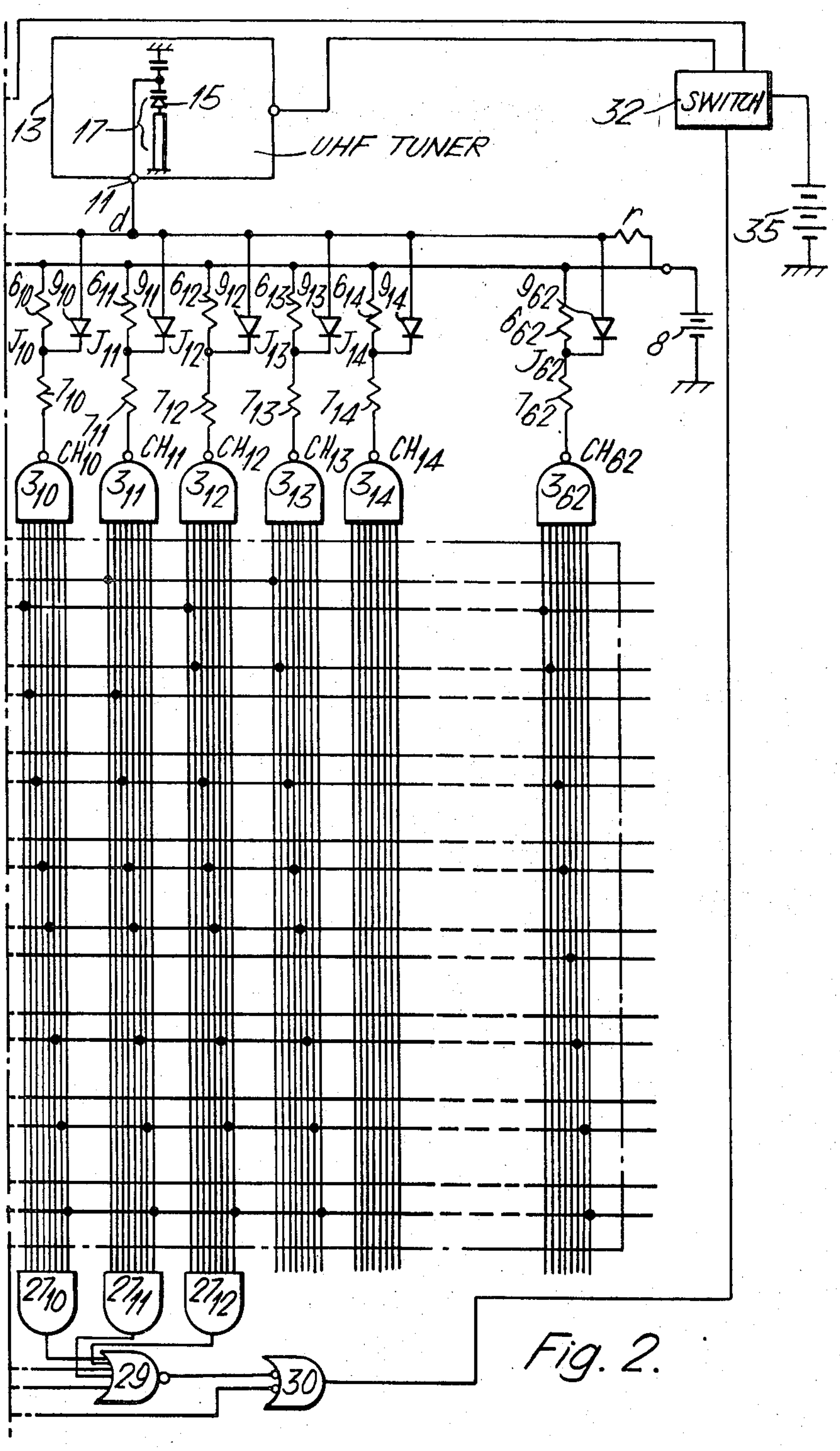
Figure 3:
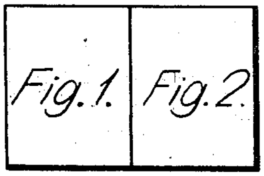
FIG. 3 is a diagram indicating how FIG. 1 and FIG. 2 should be combined.

In FIGS. 1 and 2, a first memory circuit 1 has four binary memory units $2^0$ to $2^3$ storing a binary system figure which is obtained by converting a numeral of a first digit of a channel number in the decimal system to a binary designation. A second memory circuit 2 has also four binary memory units $2^0$ to $2^3$ storing a binary system figure which is obtained by converting a numeral of a second digit of a channel number in the decimal system to a binary designation.

The binary figures are written in the memory circuits 1 and 2 by an input signal applied to an input terminal 0. The channel number stored in the memory circuits 1 and 2 in the binary system is converted by the conversion circuits 36 and 37, and the converted outputs are applied to numeral indicators 38 and 39, respectively, so as to indicate numerals of the stored channel number.

In case numeral indication tubes (Nixie tubes) are employed as the indicators 38 and 39, the conversion circuits 36 and 37 should be binary - to - decimal conversion circuits. However, in case segment-luminous type indicators are employed as the indicators 38 and 39, the conversion circuits 36 and 37 should be designed to suit the segment-luminous indicators.

Each output terminal of each of said memory units is connected to a matrix network Mtx. On the other hand, the first and second memory circuits 1 and 2 are connected to conversion circuits 36 and 37, respectively, and output terminals of the conversion circuits 36 and 37 are connected to numeral indicators, for instance, numeral-indicating gas-discharge lamps 38 and 39, respectively. Eight input terminals of logic circuits, for instance NAND-gates $3_1$ to $3_{62}$, are connected to output terminals of said matrix network Mtx. Namely, the input terminals of the logic circuits are connected with the output terminals of the memory circuits through the matrix network. The NAND-gates $3_1$ to $3_{62}$ correspond to Channels 1 to 62 of the television broadcasting channels, respectively. The matrix network Mtx comprises eight NOT-circuits $40_1$ to $40_4$ and $50_1$ to $27_4$. Thus, the apparatus comprising the network indicated in FIGS. 1 and 2 has the following relation between the memorized decimal channel number and each state of the unit binary-memories in the memory circuits 1 and 2.

| | In the second memory circuit 2 | | | | In the first memory circuit 1 | | | |
|---|---|---|---|---|---|---|---|---|
| Channel number in decimal figure | Unit memories | | | | Unit memories | | | |
| | $2^3$ | $2^2$ | $2^1$ | $2^0$ | $2^3$ | $2^2$ | $2^1$ | $2^0$ |
| CH. 1 | 0 | 0 | 0 | 0 | 0 | 0 | 0 | 1 |
| 2 | 0 | 0 | 0 | 0 | 0 | 0 | 1 | 0 |
| 3 | 0 | 0 | 0 | 0 | 0 | 0 | 1 | 1 |
| 4 | 0 | 0 | 0 | 0 | 0 | 1 | 0 | 0 |
| 5 | 0 | 0 | 0 | 0 | 0 | 1 | 0 | 1 |
| : | : | : | : | : | : | : | : | : |
| CH. 10 | 0 | 0 | 0 | 1 | 0 | 0 | 0 | 0 |
| 11 | 0 | 0 | 0 | 1 | 0 | 0 | 0 | 1 |
| 12 | 0 | 0 | 0 | 1 | 0 | 0 | 1 | 0 |
| 13 | 0 | 0 | 0 | 1 | 0 | 0 | 1 | 1 |
| 14 | 0 | 0 | 0 | 1 | 0 | 1 | 0 | 0 |
| : | : | : | : | : | : | : | : | : |
| CH. 62 | 0 | 1 | 1 | 0 | 0 | 0 | 1 | 0 |

If each of the binary memory units is constituted to produce outputs of "high level" and "low level" corresponding to the memory states 1 and 0, respectively, one selected NAND-gate only will produce a "low level" output, and the rest of the NAND-gates will produce "high level" outputs. For instance, if the memory circuits 1 and 2 store a designation of channel 1, only the binary memory unit $2^0$ of the first memory circuit 1 will produce a "high level" output. Accordingly, the lines $4_1$, $4_4$, $4_6$, $4_8$, $5_2$, $5_4$, $5_6$ and $5_8$ provide a "highlevel" output and the lines $4_2$, $4_3$, $4_5$, $4_7$, $5_1$, $5_3$, $5_5$ and $5_7$ provide a "low level" signal, causing only NAND-gate $3_1$ to be in the NAND state, namely producing a "low level" output from its output terminal.

One end of the voltage dividing resistors $7_1$ $7_{62}$ are connected to output terminals of NAND-gates $3_1$ to $3_{62}$, respectively, and the other end of said voltage dividing resistors $7_1$ to $7_{62}$ are connected to a positive terminal of D.C. power source 8 through diodes $9_1$ to $9_{62}$, respectively, and through a common resistor r. The other voltage dividing resistors $6_1$ to $6_{62}$ are connected Across the junction points $J_1$ to $J_{62}$ between each pair of said resistors $7_1$ to $7_{62}$ and the positive terminal of D.C. power source 8, respectively. A common-connection line of the diodes $9_1$ to $9_{62}$ is connected to electrodes of respective variable capacitance diodes 14 and 15 of a VHF tuner 12 and a UHF tuner 13, through the terminals 10 and 11, respectively.

When a channel numbered *n* is selected by writing in the number "*n*" into the memory circuits 1 and 2, the corresponding NAND-gate $3_n$ produces "low level" output to it output terminal, thereby causing the voltagedividing network, consisting of the resistors $6_n$ and $7_n$, and the diode $9_n$, to impart a preset voltage to the variable capacitance diodes 14 and 15, so that the tuners 12 and 13 tune in the Channel "*n*". Actually, each of the tuners 12 and 13 comprises plural tuning circuits, namely in the input stages, amplifying stages and local oscillators. In the drawing, however, these tuning circuits are represented merely by a circuit 16 in the VHF tuner and by a circuit 17 in the UHF tuner, respectively, for simplicity of description. These tuners are fed from a common power source 35, through an electronic change-over switch 35. A tap of a tuning coil in the tuner circuit 16 is connected through a semiconductor switching device, such as a switching-diode 18, to an electronic change-over switch 31 which connects negative power source 33 or positive power source 34 to the tuners 12 in response to the control signal from a NOR circuit 28. Said tuning circuits are so constituted as to tune in a desired frequency when an appropriate voltage is imparted thereto.

In the above-mentioned example, a pair of memory circuits 1 and 2 are provided, so that a channel number indicated by up to two figures, namely Channel 1 to Channel 99, may be stored. However, if three memory circuits, each having four binary memory units, are provided, a channel number indicated by up to three figures, namely up to Channel 999, may be stored.

As said binary memory units, binary memories comprising a flip-flop circuit or a shift-register circuit can be utilized. In case the constitution of the matrix circuit is suitably changed, AND-gates can be utilized in place of said NAND-gates. Accordingly, in the concept of the present invention, the phrase "logic circuits" includes both NAND-gates and AND-gates.

Each eight input terminals of the AND-gates $27_1$ to $27_3$ are connected with said matrix network Mtx. These AND-gates $27_1$ to $27_3$ correspond to Channels 1 to 3, respectively. When one of the low band channels No. 1 to 3, for instance Channel 1, is selected by writing-in the figure 1 in the memory circuits 1 and 2, in binary coded decimal form, the corresponding AND-gates, i.e., AND-gate $27_1$ produces a "high level" output signal to its output terminal. Such a "high level" output signal is converted to a "low level" output by the NOR-gate 28 and conveyed to the change-over switch 31. Consequently, the negative power source 33 is connected to an anode of the switching diode 18, so that the diode 18 becomes non-conductive thereby removing a short-circuit of a part of the tuning coil. Therefore, the inductance of the tuning coil remains large so as to tune in low channel frequencies. At the same time, the "low level" output of the NOR-gate 28 is converted to a "high level" output by a NAND-gate 30, and conveyed to the change-over switch 32, so that the switch 32 connects the power source 35 to the VHF tuner 12.

The eight input terminals of AND-gates $27_4$ to $27_{12}$ for higher VHF channels are connected to said matrix network Mtx. The output terminals of these AND-gates $27_4$ to $27_{12}$ are connected to a NOR-gate 29. These AND-gates $27_4$ to $27_{12}$ correspond to Channels 4 to 12, respectively.

When one of the VHF higher band channels, for instance, Channel 10 is selected and stored in the memory circuits 1 and 2, in binary coded decimal form, the corresponding AND-gate, i.e., gate $27_{10}$ produces a "high level" output to its output terminal. Such a "high level" output is converted by the NOR-gate 29 to a "low level" output. In this case, none of the AND-gates $27_1$ to $27_3$ produces a "high level" output, causing the NOR-gate 28 to produce a "high level" output. Therefore, the switch 31 will connect positive power source 34 to the diode 18, so that the diode 18 becomes conductive, thereby decreasing the inductance of the tuning coil to tune in higher channel frequencies.

Since the "high level" output of the NOR-gate 28 is applied to the NAND-gate 30, and since the other input to the NAND-gate 30 from the NOR-gate 29 is of "low level", the NAND-gate 30 will provide a "high level" output to the switch 32. Accordingly, the switch 32 still connects the power source 35 to the VHF tuner 12.

When any of channels having a number exceeding 12, i.e., when a UHF channel is selected and stored, none of the AND-gates $27_1$ to $27_{12}$ produces a "high level" output. Accordingly, the NAND-gate 30 produces a "low level" output to the switch 32; and, consequently, the switch 32 connects the power source 35 to the UHF tuner 13.

Figure 4:
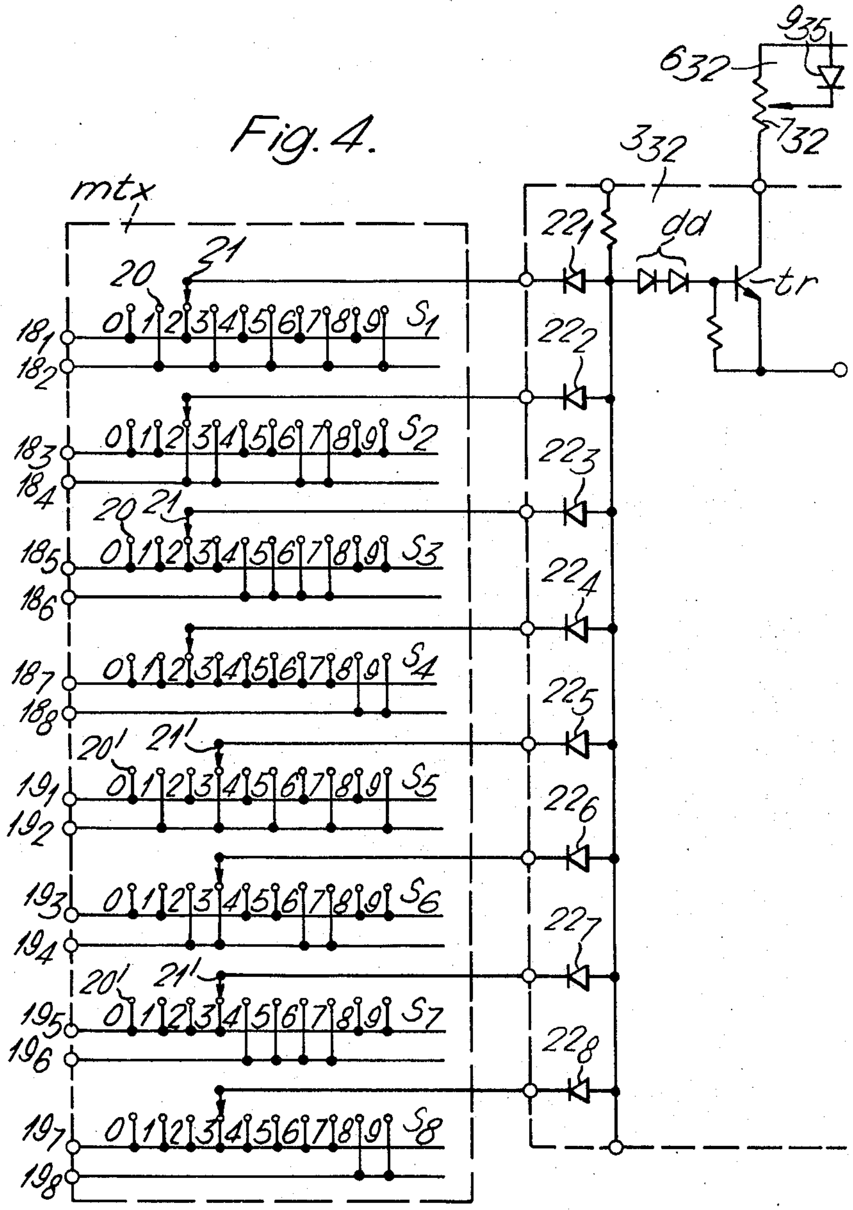
FIG. 4 illustrates an example of a NAND circuit for use in the embodiment shown in FIGS. 1 - 2.

FIG. 4 indicates one practical example ($3_{32}$) of one of said NAND-gates and the relevant part (mtx) of the matrix Mtx. In FIG. 4, terminals $18_1$ to $18_8$ and $19_1$ to $19_8$ are connected to the lines $4_1$ and $5_1$ in the matrix Mtx of FIGS. 1 and 2, respectively. As is shown in FIG. 4, a two-digit decimal digital-switch mtx is connected to the terminals $18_1$ to $18_8$ and $19_1$ to $19_8$.

Said decimal digital switch mtx comprises eight unitary switches $S_1$ to $S_8$ connected to eight pairs of said lines, respectively. Each unitary switch $S_1$ to $S_8$ has ten fixed contacts and one movable contact. The first four switch $S_1$ to $S_4$ are for presetting a numeral of a first digit of a desired channel number, and the second four switches $S_5$ to $S_8$ are for presetting a numeral of the second digit of the desired channel number. The example of FIG. 4 indicates that movable contacts 21 of the first group of unitary switches $S_1$ to $S_4$ contact respectively their third fixed contacts designated "No. 2" in the rows of fixed contacts 20, and that movable fixed contacts 21' of the second group of unitary switches $S_5$ to $S_8$ contact respectively their fourth fixed contacts designated "No. 3" in the rows of fixed contacts 20'. Therefore, the example indicates that the digital-switch mtx is preset for Channel 32. The digital switch mtx constitutes that part of said matrix Mtx which relates to the NAND-gates $3_{32}$.

Movable contacts 21 and 21' of the unitary switches $S_1$ to $S_8$ are connected to cathodes of diodes $22_1$ to $22_8$ in the NAND-gates $3_{32}$. The anodes of the diodes $22_1$ to $22_8$ are commonly connected to constitute an AND circuit and the commonly connected line is further connected through level-shift diodes dd to the base of the transistor tr for providing a NOT function. Other combinations of NAND-gates and relevant portions of the matrix Mtx are constituted in the same way. Such logic circuits as the aforementioned NAND-gate $3_{32}$ are easily available as integrated circuits.

In actual television use there is no need of providing NAND-gates $3_1$ – $3_{62}$ and voltage dividing networks $6_1 7_1$–$6_{62}$ $7_{62}$ for all of the channel numbers, since in practice, no one district is alotted more than about half of the number of whole television channels.

Since the digital switch mtx are utilized to connect the memory circuits 1 and 2 with the NAND-gates $3_1$ to $3_{62}$, the user of the set can easily select and preset and also change the preset connection in the switch for a desired channel.

Since the memory circuits 1 and 2 are connected to the numeral indicators 38 and 39 through the conversion circuits 36 and 37, respectively, when the user selects a desired channel by imparting an input signal to the memory circuits 1 and 2, the selected channel number is indicated in numerals on the numerical indicators 38 and 39, rendering the recognition of the selected channel very easy, in comparison with the conventional analogue indication dials.

This invention is also very useful for application of a remote control system to an all-wave television receiver, since the selection is made only by imparting electric signals to the memory circuits.

I claim:

1. A channel selection system for controlling tuners which includes voltage responsive variable capacitance diodes as tuning elements, comprising

- a plurality of memory circuits, each of which includes four binary memory units, each memory circuit being capable of storing one digit of a decimal numeral in binary form,
- a matrix network having a plurality of input lines and a plurality of output lines,
- a plurality of logic gates corresponding to respective channels and being connected to respective matrix network output lines, said matrix network input lines being connected to respective binary memory units, and
- voltage imparting means connected between said logic gates and the variable capacitance diodes of said tuner for selectively applying respective voltage levels to said diodes in response to actuation of a selected logic gate.

2. A channel selection system as defined in claim 1, further including a decimal numeral indicator and conversion means connected between said binary memory units and said indicator for converting the binary signals stored in said memory units to signals to be applied to said indicator for indicating a decimal channel number.

3. A channel selection system as defined in claim 1, wherein said matrix network comprises a plurality of decimal-digital switches having inputs forming said input lines and outputs forming said output lines which are connected to respective logic gates.

4. A channel selection system as defined in claim 1 wherein said voltage imparting means includes a voltage source and a plurality of voltage dividing resistor pairs connected between respective logic gates and said voltage source each of said voltage dividing resistor pairs providing a voltage corresponding to an individual channel.

5. A channel selection system as defined in claim 1, further including a plurality of additional logic gates connected to respective matrix network output lines and switching means responsive to the outputs from said additional logic gates for controlling said tuner to shift the channel frequency bands.

6. A channel selection system as defined in claim 5, wherein at least one tuner includes an inductor having at least one tap connected to a semiconductor switching device and control means for controlling said switching device to short circuit said tap in response to outputs of selected ones of said additional logic gates.

7. A channel selection system as defined in claim 6, including a first NOR gate connected to the outputs of a first group of said additional logic gates for higher channels of the VHF band, a second NOR gate connected to the outputs of a second group of said additional logic gates for lower channels of the VHF band, a NAND gate connected to the outputs of said first and second NOR gates, and an electronic switch connected to said NAND gate for selectively connecting a voltage supply to one or the other of a pair of tuners.

8. A channel selection system as defined in claim 7, further including a decimal numeral indicator and conversion means connected between said binary memory units and said indicator for converting the binary signals stored in said memory units to signals to be applied to said indicator for indicating a decimal channel number.

9. A channel selection system as defined in claim 8, wherein said matrix network comprises a plurality of decimal-digital switches having inputs forming said input lines and outputs forming said output lines which are connected to respective logic gates.

* * * * *